United States Patent [19]

Dammel et al.

[11] Patent Number: 5,510,420
[45] Date of Patent: Apr. 23, 1996

[54] MATRIX RESIN FOR HIGH-TEMPERATURE STABLE PHOTOIMAGEABLE COMPOSITIONS

[75] Inventors: Ralph R. Dammel; Owen B. Evans, both of Coventry, R.I.

[73] Assignee: Hoechst Celanese Corporation, Somerville, N.J.

[21] Appl. No.: 353,000

[22] Filed: Dec. 9, 1994

Related U.S. Application Data

[62] Division of Ser. No. 24,238, Feb. 26, 1993, abandoned.

[51] Int. Cl.⁶ ............................................. C08L 61/10
[52] U.S. Cl. ................................... 525/134; 525/480
[58] Field of Search .................................. 525/134, 480

[56] References Cited

U.S. PATENT DOCUMENTS

| | | | |
|---|---|---|---|
| 4,267,239 | 5/1981 | Thankachan et al. | 428/425.1 |
| 4,994,530 | 2/1991 | Etherington et al. | 525/386 |

FOREIGN PATENT DOCUMENTS

| | | |
|---|---|---|
| 3402791 | 8/1985 | Germany. |
| 3940793 | 6/1991 | Germany. |
| 4015540 | 11/1991 | Germany. |

OTHER PUBLICATIONS

JP 8581228/JP 6081228 (Abstract—May 9, 1985).
JP 75127619 (Abstract—Oct. 7, 1975).
JP 3229256A (Abstract—Oct. 11, 1991).

*Primary Examiner*—W. Robinson H. Clark
*Attorney, Agent, or Firm*—Andrew F. Sayko, Jr.

[57] ABSTRACT

The present invention relates to a novel matrix resin for high-temperature stable photoimageable compositions, in the form of a graft copolymer of monomeric or lower oligomeric hydroxyphenyl units grafted onto a polymer backbone containing reactive sites, to a process for its production and to its use as a matrix resin in photoimageable compositions either in a pure form or in admixture with other polymeric materials.

8 Claims, No Drawings

MATRIX RESIN FOR HIGH-TEMPERATURE STABLE PHOTOIMAGEABLE COMPOSITIONS

This is a divisional of application Ser. No. 08/024,238 filed on Feb. 26, 1993 now abandoned..

The present invention relates to a novel composition of matter, in the form of a graft copolymer of monomeric or lower oligomeric hydroxyphenyl units grafted onto a parent polymer backbone containing reactive sites, to a process for its production, and to its use as a matrix resin in photoimageable compositions either in a pure form or in admixture with other polymeric materials.

INTRODUCTION

Novolak resins are commonly used in photoresists of the dissolution inhibition type, as in the diazonaphthoquinone (DNQ)/novolak systems, which at present make up the bulk of the photoresist world market. In such systems, the novolak is used as a matrix resin because of its very strong interaction with the photoactive compound, which allows effective dissolution inhibition and particularly favorable imaging and resolution properties. As an additional strong point, these resist materials show a sufficiently good resistance (i.e., high ratio of substrate vs. resist removal) to plasma or reactive ion etch processes to be particularly useful in such applications. However, a weak point of the novolak-based materials is the comparatively low temperature at which relief structures formed from such resists deform under the influence of increased temperatures, such as may occur during dry etch processes. For most of the commercial DNQ/novolak resist materials, large structures (which are more susceptible to thermal flow than small ones) show a degradation of the edge profiles at temperatures between 100° and 130° C. Such a degradation of the edge profiles is undesirable because it translates into a linewidth change when the resist structure is transferred into the underlying substrate in a dry-etch process. While technical procedures, such as deep UV curing, are available which enhance the thermal flow resistance of the relief structures, these procedures increase the process complexity, are prone to the generation of particulate defects, and may result in difficulties when the remaining resist is to be stripped after the etch process. Inherent (i.e., unassisted by additional processing) high thermal flow resistance is therefore a desirable property of a photoresist.

Novolak resins of the type typically used in commercial photoresists have glass transition temperatures between 90° and 120° C. It has been suggested that the addition of multifunctional diazonaphthoquinones, such as, e.g., ester mixtures of trihydroxybenzophenone-2,1,5- or -2,1,4-diazonaphthoquinone sulfonates, increases the glass transition temperature of the resist through partial crosslinking of the resin by thermal ketene formation from the diazonaphthoquinone, and subsequent addition to the resin hydroxy groups to form a phenolate ester of indenecarboxylic acid. Such a mechanism would explain the observation of thermal flow stabilities which exceed the matrix resin's glass transition temperature, while at the same time providing a reason for the (weak) correlation between resin glass transition temperature and thermal flow temperature.

It should therefore be possible to use as matrix resins phenolic resins with higher glass transition temperature in order to increase the thermal flow stability of the photoresist. One such phenolic resin is poly(4-hydroxystyrene), which has a glass transition temperature of 182° C., which Would make it very well suited for a high-temperature stable resist. However, poly(4-hydroxystyrene) has a very high dissolution rate in standard strength developers, e.g., in 2.38% TMAH developer, its dissolution speed is between 12 and 20 μm/min, depending on the molecular weight. With such a high dissolution rate, poly(4.-hydroxystyrene) is very difficult to inhibit; resist formulations of poly(4-hydroxystyrene) and diazonaphthoquinones typically show very high dark erosion rates which are incompatible with high-resolution applications. The obvious way to increase the thermal stability of novolak resists by substituting part of the novolak resin by poly(4-hydroxystyrene) is not successful since poly(4-hydroxystyrene) and novolak show polymeric incompatibility leading to the formation of domain structures, as evidenced by cloudiness of spin-east films and loss of resolution in imaging.

SUMMARY OF THE INVENTION

The present invention proposes to use a novel composition of matter to provide a photoresist matrix resin with both high thermal stability and good dissolution inhibition. To this purpose, a resin possessing a high glass transition temperature and containing reactive sites on an aromatic structure is reacted with monomeric or oligomeric phenolic units in such a way that the monomeric or oligomeric phenolic units are attached to the aromatic rings of the polymer. Such a structure is commonly called a graft or comb co-polymer. In the preferred embodiment of this invention, monomeric, dimeric or higher oligomeric methylene phenol units are attached to a parent polymer, such as to the 3- and/or 5- positions of poly(4-hydroxystyrene), to form the graft co-polymer. It is found that the graft co-polymer possesses both high thermal stability and good dissolution inhibition, i.e., it combines the good properties of both the parent polymer, e.g. poly(4-hydroxystyrene) and the grafted polymer, e.g. a novolak resin.

The present invention relates to a composition comprising a parent polymer containing aromatic rings with reactive sites to which side groups containing hydroxy-substituted aromatic rings have been attached by a covalent chemical bond. The parent polymer is preferably a homo- or co-polymer of a hydroxy-substituted styrene, e.g. a homo- or co-polymer of 4-hydroxystyrene, 3hydroxystyrene or 2-hydroxystyrene.

In a preferred embodiment, the graft groups comprise hydroxymethyl-substituted aromatic systems of the general formula:

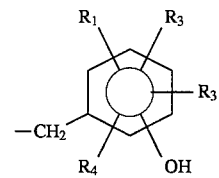

where $R_1$ to $R_4$ can be hydrogen, $C_1$ to $C_4$ alkyl, hydroxy, or methylene aryl groups of the general formula:

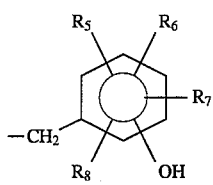

where $R_5$ to $R_8$ can be hydrogen, $C_1$ to $C_4$ alkyl or hydroxy.

The number of aromatic rings in the side chain is preferably from 1 to 4. The side chains can be all-ortho bonded novolak traits of the general structure:

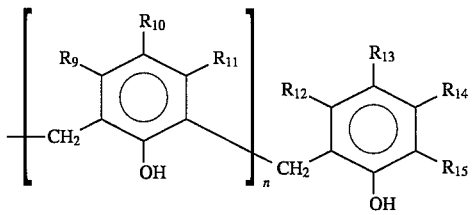

where $R_9$ to $R_{15}$ are independently H, hydroxy, or $C_1$ to $C_4$ alkyl, and where n is 0 to 3.

Non-limiting examples for such graft groups include:

1) the monomeric graft groups, such as the following methylene phenols or mixtures thereof: 4-hydroxybenzyl alcohol, 2-hydroxybenzyl alcohol, 3-hydroxybenzyl alcohol, 2-hydroxymethyl-p-cresol, 2-hydroxymethyl-m-cresol, 4-hydroxymethyl-m-cresol, 6-hydroxymethyl-2,4-xylenol, 4-hydroxymethylresorcinol;

2) the dimeric graft groups:

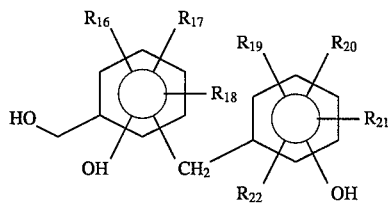

where $R_{16}$ to $R_{22}$ can be hydrogen, $C_1$ to $C_4$ alkyl, or hydroxy, such as

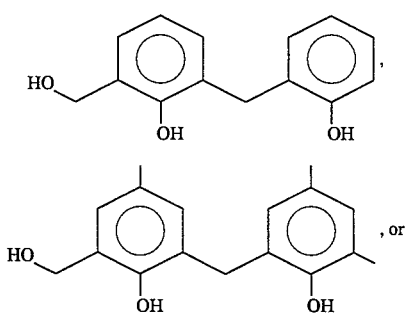

3) the trimeric graft groups, where for the first time it is possible to have a branching side chain:

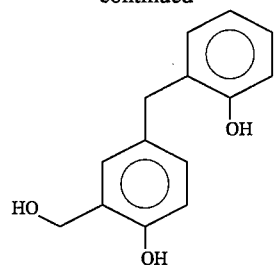

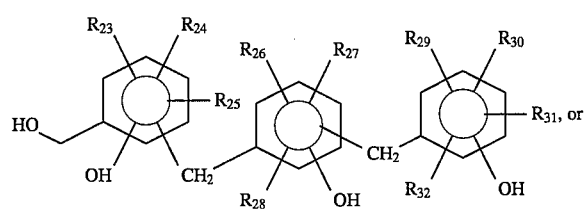

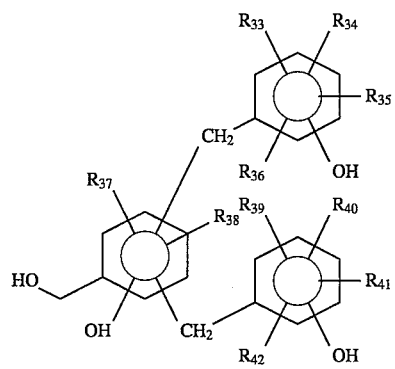

where $R_{23}$ to $R_{42}$ can be hydrogen, $C_1$ to $C_4$ alkyl or hydrogen; non-limiting examples for which are:

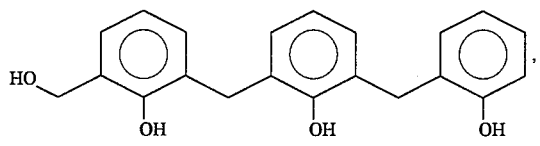

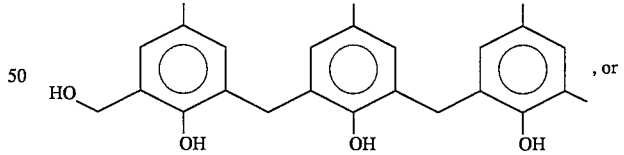

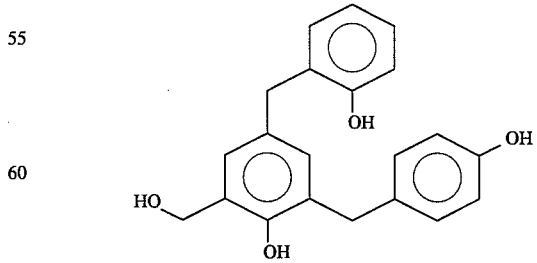

The present invention also relates to a process for preparing the composition of the present invention by mixing a parent polymer and the graft groups under conditions conducive to the formation of a covalent chemical bond between the graft groups and the parent polymer. The parent polymer is preferably a homo- or co-polymer of a hydroxy-substituted styrene, more preferably a homo- or co-polymer of 4-hydroxystyrene, 3-hydroxystyrene or 2-hydroxystyrene. In a preferred process, the graft groups are systems of the general formula:

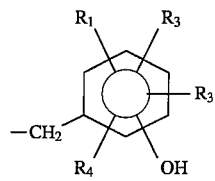

where $R_1$ to $R_4$ can be hydrogen, $C_1$ to $C_4$ alkyl, hydroxy, or methylene aryl groups of the general formula:

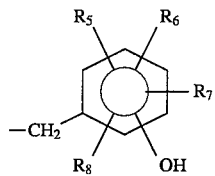

where $R_5$ to $R_8$ can be hydrogen, $C_1$ to $C_4$ alkyl or hydroxy. The side chains may be substantially all-ortho bonded novolak units of the general structure:

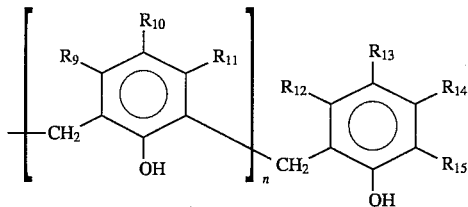

where $R_9$ to $R_{15}$ are independently H, hydroxy, or $C_1$ to $C_4$ alkyl, and where n is 0 to 3. The graft groups may be monomeric methylene phenols or mixtures of methylene phenols, such as one or more of 4-hydroxybenzyl alcohol, 2-hydroxybenzyl alcohol, 3-hydroxybenzyl alcohol, 2-hydroxymethyl-p-cresol, 2-hydroxymethyl-m-cresol, 4-hydroxymethyl-m-cresol, 6-hydroxymethyl-2,4-xylenol, or 4-hydroxymethylresorcinol. The subject process may further comprise mixing the parent polymer and the graft groups under conditions conducive to the formation of a chemical bond between the graft groups and the parent polymer, the parent polymer is preferably a homo- or co-polymer of a hydroxy-substituted styrene, e.g. a homo- or co-polymer 4-hydroxystyrene, 3-hydroxystyrene or 2-hydroxystyrene.

In a preferred process, the graft groups are systems of the general formula:

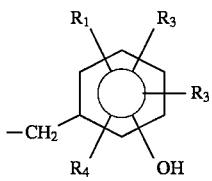

where $R_1$ to $R_4$ can be hydrogen, $C_1$ to $C_4$ alkyl, hydroxy, or methylene aryl groups of the general formula:

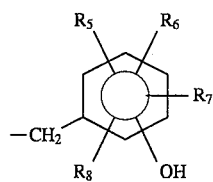

where $R_5$ to $R_8$ can be hydrogen, $C_1$ to $C_4$ alkyl or hydroxy.

DETAILED DESCRIPTION OF THE PREFERRED EMBODIMENTS

The oligomeric graft groups may be synthesized by successive hydroxymethylation/nucleophilic addition reactions. Unless mixtures are desired, it may be necessary to use protective groups to obtain some of the substitution patterns. Particularly advantageous are bromine or chlorine protective groups which may be removed by hydrogenation before or after introduction into the polymer. All-ortho linear graft groups may alternatively be synthesized via selective chain growth reactions, e.g. by the reaction of salicyl alcohol with methylmagnesium bromide, even if the para positions are free. For successive hydroxymethylation/nucleophilic addition reactions, it is particularly advantageous to start with an o,p-disubstituted phenol, hydroxymethylation of which results in a well-defined product. By further reaction with p-cresol, well-defined graft groups may be obtained:

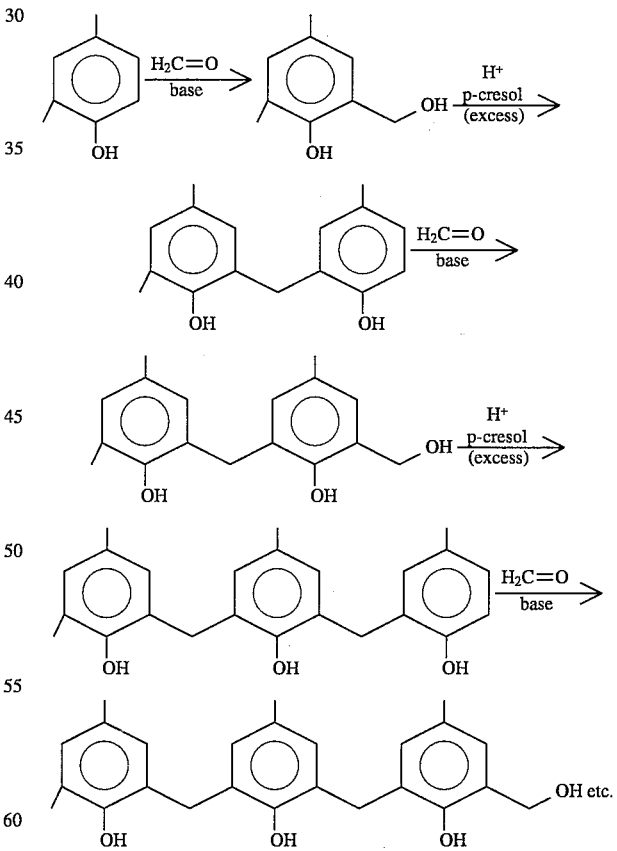

The graft groups are then attached to the parent polymer in a nucleophilic addition reaction. In the particular case of hydroxyethyl groups, this may be effected using an acid catalyst. In the preferred Case of poly(4-hydroxystyrene) as the parent polymer, this results in the attachment, via a methylene bridge, of one or possibly two graft groups in ortho position to the hydroxy group. A distinction may be made between those graft groups which do not possess reactive sites for further addition and those which possess one or more such sites. In the following, the former will be called terminated graft groups, and the latter unterminated graft groups.

Terminated graft groups may react with the parent poly(4-hydroxystyrene) only by mono-or di-substitution. This reaction will result in the formation of di- and trimeric pendant novolak units for monomeric pendant graft groups, tri- and pentameric pendant novolak traits for monomeric graft groups, etc. In contrast, with the unterminated graft groups, every addition generates one or more reactive sites in the pendant chain for each addition site used. With unterminated graft groups, it would therefore be possible in principle to build an arbitrarily long sidechain.

Practical experimentation shows, however, that under the conditions of the grafting experiment, the addition to the reactive sites of the polymer is not the only reaction that occurs. The GPC traces of the grafting reaction products (Example 3) show that, even for terminated graft groups, a) there is a low molecular weight fraction formed, the relative amount of which increases with the loading of the graft groups;

b) the molecular weight of the graft copolymer increases more quickly than can be explained by the addition of the graft groups.

Both effects are presumably due to side reactions of the graft groups. One possible side reaction is ether formation e.g.

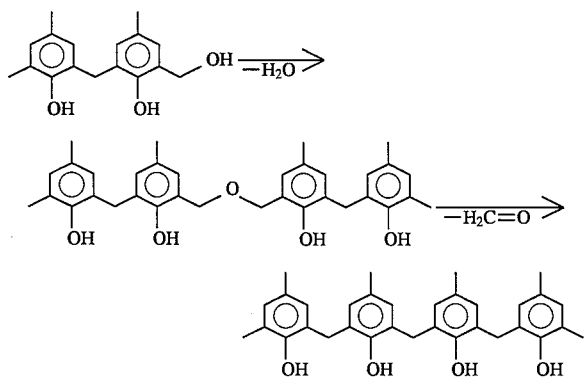

In a second step, formaldehyde is liberated from the ether to yield an oligomeric novolak (a tetramer in this example). Under the conditions of the graft group addition, formaldehyde may add to the graft copolymer (either to reactive sites in the main chain or to reactive sites in the pendant side chains, e.g., on unterminated graft groups). The methylol groups thus formed may react in turn with other reactive sites on the polymer, leading to partial cross-linking and a concomitant large increase in molecular weight.

A second possible side reaction is cleavage of the methylene bridges, which is known to occur in novolaks under acidic conditions. Such methylene group cleavage might lead to untermination of supposedly terminated graft groups, to the formation of odd-numbered novolak oligomers by cleavage and/or recombination of graft groups, or partial crosslinking of the polymer if new methylol groups/reactive sites are generated on pendant side chains.

The extent to which these reactions occur depends largely on the nature of the reaction conditions and the catalyst employed. It is believed that strong acids, such as. e.g., methanesulfonic acid or oxalic acid, will generally favor cleavage reactions, while weaker acids such as, e.g., acetic or maleic acid, or Lewis acid catalysts, such as, e.g., magnesium or zinc ions, will minimize methylene bond cleavage reactions. Cleavage reactions will also generally be favored by long reaction times and higher reaction temperatures.

The glass transition temperatures of the products obtained from the reaction between the graft groups and the parent poly(4-hydroxystyrene) were slightly lowered with respect to those of the parent polymer (Example 3). However, they were still much higher than generally observed for the novolak resins used in lithography. The dissolution rate tests performed on the graft co-polymers showed that it is indeed possible to reduce the dissolution rate of poly(4-hydroxystyrene) by the attachment of pendant, novolak-like sidechains (Example 3). Dimeric graft groups proved to be more effective in reducing the dissolution rate than monomeric ones. In fact, at higher degrees of grafting (20 mole % and above), the reduction in dissolution rate caused by dimeric graft groups was found to be larger than necessary for lithographic work, which led to a low photospeed in resist formulations with diazonaphthoquinone sensitizers.

The copolymers comprising the matrix resin of the present invention may be mixed with one or more novolak resins in photoresist compositions. Such photoresists also contain a photosensitizer and a suitable solvent. The compositions of the present invention may be used in an amount between 1 and 99% (by weight, w/w), preferably between 15 and 75% w/w, more preferably between 30 and 70%, most preferably between 40 and 60%, of the resin mixture.

The matrix resin comprising the composition of the present invention may further comprise a base soluble or base-swellable additional polymeric or oligomeric material. The additional polymeric material may be polyhydroxystyrene derivative or a novolak.

When the polymers were mixed with novolak resin in order to obtain photoresists with higher sensitivities, it was totally unexpectedly found that the polymeric incompatibility of the parent poly(4-hydroxystyrene) with novolak was greatly decreased for the graft copolymers with higher degrees of grafting (Example 9). It proved possible to obtain high-resolution structures of 0.4 μm lines and spaces in a resist formulation employing a diazonaphthoquinone sensitizer under process conditions which are commonly employed in the industry. The thermal properties of the finished resist relief structures proved also to be most satisfactory. Large structures, for which the thermal flow temperature is known to be lower than the one observed for small features, showed no evidence at all of flow after heating at 135° C. for 2 minutes on a hotplate, irrespective of whether the pure graft co-polymer or a 1:1 mixture with a novolak resin was used. In comparison, the same resist formulation using only the novolak resin showed, after identical processing, a beginning deterioration of the sidewall angle of large features at about 120° C., clearly visible deterioration at 125° C., and severe deformation at 130° C.

Additionally, it was found that the UV absorptivity of the graft co-polymers was comparable to that of the parent poly(4-hydroxystyrene) even for high degrees of substitution with all-ortho novolak-like sidechains (Example 7). This unexpected property makes the graft co-polymers useful as matrix polymers in resists intended for use with UV2 (220–260 nm; deep UV) radiation. The high glass transition temperature of the graft co-polymers may also be expected to translate into a high mechanical hardness, which makes there useful as matrix resins for positive-tone printing plates with a high resistance to mechanical wear during the printing process.

The following examples are provided to illustrate the invention. They are not intended to limit the scope of the invention in any way.

EXAMPLE 1

Synthesis of a Terminated Monomeric Graft Group 2,4-dimethyl-6-(hydroxymethyl)phenol 75 g of NaOH were dissolved in 300 ml of deionized (DI) water. 183.3 g 2,4-dimethylphenol were added, and the mixture was cooled to 15°–20° C. 188 g of aqueous formaldehyde (made from 152g 37% formalin diluted with 36 g water) were added over half an hour, while the temperature was maintained below 20° C. After stirring overnight, Thin Layer Chromotography (TLC) in 2:1 hexane/ethyl. acetate showed a single spot, and no remaining 2,4-dimethylphenol. The pH was then adjusted to 6–7 with about 200 ml of 50% aqueous acetic acid. The mixture was transferred to a 2 liter beaker, and extracted with ethyl acetate (400 ml). Removal of the ethyl acetate in a vacuum gave 221.0 g (97.4%) of the desired product as a clear oil or a low-melting solid.

EXAMPLE 2

Synthesis of a Terminated Dimeric Graft Group 1. 1-(2-hydroxy-5-methyl)phenyl- 1-(2-hydroxy-3,5-dimethylphenyl)methane 75.6 g of 2,4-dimethyl-6-(hydroxymethyl)phenol (Experiment 1) and 432.6 g p-cresol were charged into a 1 liter 3-necked flask. I ml of methanesulfonic acid was added with rapid stirring, whereupon the temperature rose form 35° to 60° C. The mixture .was stirred for 4 hours at 45°–500° C., stirred overnight at ambient temperature, and reacted at 65°–70° C. for 6 hours. No new spot was observed in the TLC. The mixture was diluted with 250 ml methanol and drowned out into 3 liters of water. A very gummy precipitate was obtained by decantation which was dissolved in 500 ml methanol. A second drownout step again resulted in a gummy mixture. The product was finally isolated from the methanol solution by distilling off methanol, water and p-cresol under reduced pressure, taking up the glassy residue in 500 ml of methanol, and drowning out into ice water. After drying, the yield was 98.5 g (81.6%) of a white powder melting at 138°–140° C. The TLC showed a single spot close to that of the p-cresol educt.

2. 1-(2-hydroxy-3-hydroxymethyl-5-methyl)phenyl-1-(2-hydroxy-3,5-dimethylphenyl)methane To a solution of 16.0 g of NaOH in 300 ml of water were added 90 g of 1-(2-hydroxy-5-methyl)phenyl- 1-(2-hydroxy-3,5-dimethylphenyl)methane over a period of half an hour. 45 g of 34% formalin Were added to the mixture over a period of 30 minutes at a temperature of 25°–30° C. The reaction mixture was stirred at room temperature for three hours, whereupon TLC in hexane/ethyl acetate showed a large amount of starting material and one lower (r.f.) spot. After stirring over the weekend at ambient temperature, TLC showed no starting material present, and a single new spot. The pH was adjusted to 7 with 45 ml of glacial acetic acid, which led to a heavy precipitation of a solid product. After diluting with 250 ml of water and stirring for half an hour, the product was filtered off and washed with 2 liters of DI water, then dried in vacuo at 60° C. The yield was 98.0 g of tan crystals, melting at 134°–136° C.

EXAMPLE 3

General Procedure for the Synthesis of Poly(4-Hydroxystyrene) Graft Co-Polymers 60 g of poly(4-hydroxystyrene) were dissolved in 300 ml of propyleneglycolmonomethylether (PGME), and the desired amount of the graft group was added. After adding 2.0 ml Of methanesulfonic acid, the mixture was stirred for 1 hour, allowed to sit overnight, and then heated to 100° C. for 5 hours. No trace of the graft group was observed by TLC after this period. After cooling, the mixture was diluted with 250 ml of methanol and drowned out into 7 l of DI water over a period of 45 min. The resulting slurry was stirred for 1 hour, filtered, washed with 6 liter of DI water, and dried in vacuo at 40° C. The graft co-polymers were obtained as yellow to brownish granular solids or powders.

The polymers were characterized by Differential Thermal Calorimetry (DTC) measurements to obtain their glass transition temperatures, by gel permeation chromatography (GPC) vs. polystyrene standard to obtain molecular weights and molecular weight distributions, and by dissolution rate measurements on resin-coated silicon wafers. The resin coating was applied in a spin-coating process from an approx. 25% resin solution in propyleneglycol monomethylether acetate (PGMEA) to silicon wafers, which were then baked for 30 rain in a convection oven at 90° C. The initial film thickness of the resins was between 1.5 and 2.0 μm. The dissolution rate measurements were Carried out using a Xynex laser interferometer for endpoint detection on immersion-developed wafers. A commercial metal-ion free developer, AZ312 MIF (available from Hoechst Celanese Corporation), was used (base concentration 2.38% w/w tetramethylammonium hydroxide, or 0.265N).

EXAMPLE 4

Synthesis and Characterization of Poly(4-Hydroxystyrene) Graft Co-Polymers Using a Terminated Dimeric Graft Group A series of graft co-polymers were synthesized using the general procedure of Example 3, starting from a poly(4-hydroxystyrene) of molecular weight 10,000 and dispersity 1.4 (obtained by free radical polymerization and subsequent deprotection of 4-acetoxystyrene). The graft group used was 1-(2-hydroxy-3-hydroxymethyl-5-methyl)phenyl-1-(2 -hydroxy-3,5-dimethylphenyl)methane (of Example 2), a dimeric, terminated graft group. The graft group was used in an amount of 10, 15 and 20 mole %, relative to the number of; monomer units in the poly(4-hydroxystyrene). With the exception of the first experiment in the series, the yields of the corresponding graft co-polymers were practically quantitative:

| polymer number | 4-1 | 4-2 | 4-3 |
| --- | --- | --- | --- |
| amount of graft group (mole-%) | 10 | 15 | 20 |
| weight of graft group | 13.5 | 20.3 | 27 |
| weight of poly(4-hydroxystyrene) | 60 | 60 | 60 |
| weight of isolated graft co-polymer | 62.7 | 77.3 | 84.4 |

The glass transition temperatures of the polymers were somewhat lower than that of the starting poly(4-hydroxystyrene) (P4HS), but still in a range beyond that which is typical for novolaks:

| | mole-% of graft groups added | glass transition temperature |
|---|---|---|
| parent P4HS | 0 | 182 |
| polymer 4-1 | 10 | 168.7 |
| polymer 4-2 | 15 | 163.8 |
| polymer 4-3 | 20 | 160.4 |

The GPC experiment revealed one of the reasons for the decrease in glass transition temperature (which would not necessarily be expected to occur by addition of side chains of this size and nature). As already discussed above, ether formation and subsequent formaldehyde extrusion as well as methylene bond breakage may lead to the formation of a 10w molecular weight fraction. The products 4-1 to 4-3 therefore show a greatly increased polydispersity. As may also be seen by inspection of the Table below, :the weight average molecular weight increases far more quickly with increasing amounts of graft groups than can be explained by the simple weight addition. As explained above, this effect is presumed to be due to a partial crosslinking of the parent polymer by free formaldehyde.

| | mole-% graft groups | experimental. weight av. molecular weight | expected weight av. molecular weight | number av. molecular weight | poly. dispersity |
|---|---|---|---|---|---|
| parent P4HS | 0 | 10,000 | 10,000 | 7,100 | 1.4 |
| polymer 4-1 | 10 | 27,237 | 13,100 | 1,567 | 17.4 |
| polymer 4-2 | 15 | 35,986 | 14,650 | 2,831 | 12.7 |
| polymer 4-3 | 20 | 61,964 | 16,200 | 2,736 | 22.7 |

The dissolution rates of the graft co-polymers 4-1 to 4-3 were determined as follows:

| | mole-% graft groups | dissolution rate in 0.265 N TMAH [μm/min] |
|---|---|---|
| parent P4HS | 0 | ca. 18.7 |
| polymer 4-1 | 10 | 3.69 |
| polymer 4-2 | 15 | 1.18 |
| polymer 4-3 | 20 | 0.35 |

EXAMPLE 5

Synthesis of Poly(4-Hydroxystyrene) Graft Co-Polymers Using Unterminated Monomeric Graft Groups A commercial poly(4-hydroxystyrene) polymer, Maruka Lynkur, obtained from Maruzen America, Inc., with an initial Weight average molecular weight of 7,500 and an initial polydispersity of 2.0 was reacted according to the general procedure of Example 3 with various amounts of 1.) 4-hydroxybenzyl alcohol, and 2.) 2-hydroxybenzyl alcohol. The following results were obtained for dissolution rate R (in 0.265N aqueous tetramethylammonium hydroxide developer), molecular weight, and polydispersity:

| 1. 4-Hydroxybenzyl alcohol | | | | | | |
|---|---|---|---|---|---|---|
| Experiment number | % w/w grafter | R [μm/min] | MW | D | Ratio MW/MW0 | Ratio D/D$_0$ |
| 5-1-1 | 15 | 9.147 | 8,855 | 6.86 | 1.18 | 3.4 |
| 5-1-2 | 20 | 8.566 | 9,036 | 7.34 | 1.20 | 3.6 |
| 5-1-3 | 25 | 7.885 | 15,006 | 12.7 | 2.0 | 6.4 |

| 2. 2-Hydroxybenzyl alcohol | | | | | | |
|---|---|---|---|---|---|---|
| Experiment number | % w/w grafter | R [μm/min] | MW | D | Ratio MW/MW$_0$ | Ratio D/D$_0$ |
| 5-2-1 | 15 | 8.906 | 7,451 | 7.71 | 1.00 | 3.9 |
| 5-2-2 | 20 | 9,685 | 8,129 | 8.31 | 1.08 | 4.2 |
| 5-2-3 | 25 | 9.028 | 9,841 | 11.8 | 1.31 | 5.9 |

EXAMPLE 6

UV Absorption of Poly(4-hydroxystrene) Graft Co-Polymers

The graft co-polymers of Example 4:were dissolved in methanol at concentrations of approx. 100 mg/liter. This concentration was chosen because in the 1 cm couvettes used, it closely approximates the absorptivity of a 1 μm thick film of the resin. At 248 nm, the following absorptivities were obtained:

| | mole-% graft groups | absorptivity at 248 nm of a 100 mg/l solution in MeOH | ratio vs. parent polyhydroxystyrene |
|---|---|---|---|
| parent P4HS | 0 | 0.07 | 1 |
| polymer 4-1 | 10 | 0.09 | 1.29 |
| polymer 4-2 | 15 | 0.095 | 1.36 |
| polymer 4-3 | 20 | 0.10 | 1.43 |

EXAMPLE 7

Lithographic Evaluation of Poly(4-Hydroxystyrene) Graft Co-Polymers

The graft co-polymers of Example 4 were mixed in a concentration of 80% w/w of solids with a diazonaphthoquinone sensitizer at 20% of solids, with sufficient propyleneglycolmonomethylether acetate added to make up a photoresist solution of approximately 23% w/w solids content. The photosensitizer used consisted of an ester mixture of diazonaphthoquinone-2,1,4- and-2,1,5-sulfonates of 1,1, 1-tris-(4-hydroxyphenyl)ethane, with a 2,1,4-sulfonate to 2,1,5-sulfonate ratio of about 3:7, and a total degree of esterification of about 100%. The photoresist solutions were then coated onto silicon wafers by spin coating to yield an approx. 1 μm thick film, after drying on a hotplate at 100° C. for 1 minute. Exposure on a Nikon i-line stepper with a numerical aperture of 0.54, followed by a 1 min/100° C. post exposure bake on a hotplate and by immersion development in 0.265N TMAH for 60 sec yielded the following results:

| photo-resist from: | mole-% graft groups | resolution limit (µm lines & spaces) | photo-speed (mJ/cm$^2$) | remarks |
|---|---|---|---|---|
| polymer 4-1 | 10 | 0.50 | 66 | structures look pockmarked, wall angles >80°. |
| polymer 4-2 | 15 | 0.40 | 150 | less pockmarking and scum, vertical sidewalls |
| polymer 4-3 | 20 | 0.40–0.35 | 290 | good structures w. vertical sidewalls, still somewhat underexposed |

The thermal stability of the structures was then tested using large resist pads (50×50 µm). The wafers containing the features were postbaked at various temperatures for two minutes on a hotplate, and then examined relative to an unbaked reference structure. No evidence for thermal flow or wall angle degradation could be observed up to the highest temperature studied (135° C.). In contrast, a novolak-containing photoresist with the same sensitizer showed evidence for beginning thermal flow at 115° C. after identical processing (cf. Comparative Example 9).

EXAMPLE 8

Lithographic Evaluation of Poly(4-Hydroxystyrene) Graft Co-Polymers In Mixtures With Novolak Resins The procedure of Example 7 was repeated with the difference that the matrix resin used in the photoresist was not the pure graft copolymers of Example 4, but a 1:1 mixture of said graft co-polymers with a novolak. The novolak used consisted of a formaldehyde polycondensate of a m-cresol/3,5-xylenol mixture and exhibited a glass transition temperature of 105° C. as well as a dissolution rate of about 2.4 µm/min in the developer of Example 7. Using the photoresist process of Example 7, the following results were obtained for the mixtures:

| photoresist from: | resolution limit (µm lines & spaces) | photo-speed (mJ/cm$^2$) | remarks |
|---|---|---|---|
| polymer 4-1, and novolak, 1:1 | 0.50 | 190 | structures look pockmarked, heavy scum evident, possible strong polymer incompatibility |
| polymer 4-2 and novolak, 1:1 | 0.40 | 200 | less pockmarking and scum, less incompatibility |
| polymer 4-3 and novolak, 1:1 | 0.40 | 200 | good structures w. vertical sidewalls, no scum evident, no signs of polymer incompatibility.. |

The 1:1 mixtures showed improved thermal stability over identically process samples of the pure novolak resin. No thermal flow was evident at bake temperatures of 130° C.

When a 9:1 mixture of polymer 4-3 with the novolak was investigated as above, the structure transfer quality remained unchanged, but no thermal stability improvement was observed.

COMPARATIVE EXAMPLE 9

Lithographic Evaluation of a Novolak Resin

The novolak used consisted of a formaldehyde polycondensate of a m-cresol/3,5-xylenol mixture and exhibited a glass transition temperature of 105° C. as well as a dissolution rate of about 2.4 µm/min in Standard 0.265N aqueous tetramethylammonium hydroxide developer. A photoresist was formulated with this novolak in the manner described in Example 7, with the difference that the novolak was used as the marix resin instead of the graft co-polymers. The same photoresist process and test method as in Examples 7 and 8 yielded a photospeed number of 190 mJ/cm$^2$ and a maximum resolution of 0.35 µm for line&space features. The thermal stability test of Examples 7 and 8 yielded evidence of beginning degradation of the resist wall angle at 115° C., and showed severe flow above 120° C.

What is claimed is:

1. A process for preparing a composition useful as a matrix resin in a photoimageable composition..consisting essentially of a parent polymer containing aromatic rings with reactive sites to Which graft groups of the general formula are attached by a covalent bond:

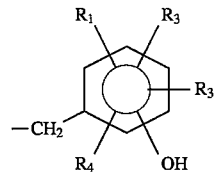

wherein $R_1$ to $R_4$ are hydrogen, $C_1$ to $C_4$ alkyl, hydroxy or methylene aryl groups of the general formula:

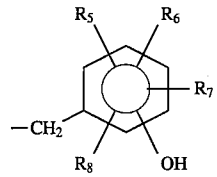

where $R_5$ to $R_8$ are hydrogen, $C_1$ to $C_4$ alkyl or hydroxy wherein the number of aromatic rings in the graft group is 1 to 4, wherein the process comprises mixing the parent polymer and the graft groups in a nucleophilic addition reaction under conditions conducive to the formation of a covalent chemical bond between the graft groups and the parent polymer.

2. The process of claim 1 wherein the parent polymer is a homo- or co-polymer of a hydroxy-substituted styrene.

3. The process of claim 2 wherein the parent polymer is a homo- or co-polymer of hydroxystyrene, 3-hydroxystyrene or 2-hydroxystyrene.

4. The process of claim 1 wherein the graft groups are substantially all-ortho bonded novolak units of the general structure:

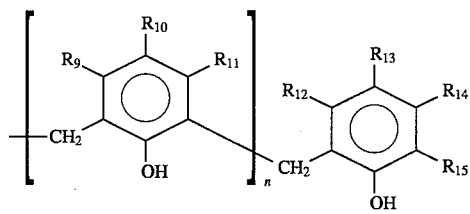

where $R_9$ to $R_{15}$ are independently H, hydroxy, or $C_1$ to $C_4$ alkyl, and where n is 0 to 3.

5. The process of claim 4 wherein n is 0 or 1, and $R_2$, $R_5$, and $R_7$ are methyl, and $R_1$, $R_3$, $R_4$, and $R_6$ are hydrogen.

6. The process of claim 1 wherein the graft groups are a monomeric methylene phenol or a mixture of methylene phenols.

7. The process of claim 6 wherein the monomeric graft groups are chosen from one or more of 4-hydroxybenzyl alcohol, 2-hydroxybenzyl alcohol, 3-hydroxybenzyl alcohol, 2-hydroxymethyl-p-cresol, 2-hydroxymethyl-m-cresol, 4-hydroxymethyl-m-cresol, 6-hydroxymethyl-2,4-xylenol, or 4-hydroxymethylresorcinol.

8. A method of using a composition as a matrix resin in a photoimageable material, wherein the photoimageable material is applied to a substrate and the composition consists essentially of a parent polymer containing aromatic rings with reactive sites to which graft groups of the general formula are attached:

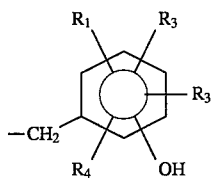

where $R_1$ to $R_4$ are hydrogen, $C_1$ to $C_4$ alkyl, hydroxy or methylene aryl groups of the general formula:

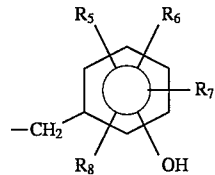

where $R_5$ to $R_8$ are hydrogen, $C_1$ to $C_4$ alkyl or hydroxy wherein the number of aromatic rings in the graft group is 1 to 4.

* * * * *